(12) United States Patent
Nagami

(10) Patent No.: US 9,865,579 B2
(45) Date of Patent: Jan. 9, 2018

(54) DISPLAY DEVICE HAVING DRIVER IC DIRECTLY CONNECTED TO SUBSTRATE

(71) Applicant: JAPAN DISPLAY INC., Tokyo (JP)

(72) Inventor: Takahiro Nagami, Mobara (JP)

(73) Assignee: JAPAN DISPLAY INC., Tokyo (JP)

( * ) Notice: Subject to any disclaimer, the term of this patent is extended or adjusted under 35 U.S.C. 154(b) by 37 days.

(21) Appl. No.: 14/734,375

(22) Filed: Jun. 9, 2015

(65) Prior Publication Data
US 2015/0270251 A1 Sep. 24, 2015

Related U.S. Application Data

(63) Continuation of application No. 13/845,400, filed on Mar. 18, 2013, now Pat. No. 9,093,592.

(30) Foreign Application Priority Data

Apr. 10, 2012 (JP) .................................. 2012-088871

(51) Int. Cl.
*H01L 25/18* (2006.01)
*H01L 33/08* (2010.01)
(Continued)

(52) U.S. Cl.
CPC ............ *H01L 25/18* (2013.01); *G02F 1/1368* (2013.01); *G02F 1/13454* (2013.01);
(Continued)

(58) Field of Classification Search
CPC .... H01L 29/786; G02F 1/1362; G09G 3/3611
See application file for complete search history.

(56) References Cited

U.S. PATENT DOCUMENTS

| 6,366,331 | B1 | 4/2002 | Sakamoto et al. |
| 7,446,398 | B2 * | 11/2008 | Niu .................. H01L 23/49816 257/668 |

(Continued)

FOREIGN PATENT DOCUMENTS

| JP | 2000-221540 A | 8/2000 |
| JP | 2002311452 A | 10/2002 |

OTHER PUBLICATIONS

Office Action dated Mar. 1, 2016 regarding Japanese Patent Application No. 2012-088871.

*Primary Examiner* — Mohammad Choudhry
(74) *Attorney, Agent, or Firm* — Typha IP LLC

(57) ABSTRACT

In a display device connected with an IC driver, particularly the reliability of connection between an IC terminal located on the outermost side and the IC driver is improved. IC terminals and flexible wiring board terminals are formed on a terminal region of a TFT substrate. A plurality of the IC terminals are formed at a predetermined pitch. The reliability of an outermost IC terminal is degraded as compared with the reliability of the other IC terminals caused by the loading effect in etching a protection insulating film. In order to prevent this degradation, a dummy terminal is formed on the outer side of the outermost IC terminal, and the loading effect on the outermost IC terminal is made equal to the loading effect on the other IC terminals. Accordingly, degradation in the reliability of the outermost IC terminal is prevented.

8 Claims, 13 Drawing Sheets

(51) Int. Cl.
*H01L 27/32* (2006.01)
*G02F 1/1345* (2006.01)
*G02F 1/1368* (2006.01)
*H01L 23/522* (2006.01)
*H01L 23/532* (2006.01)
*H01L 27/12* (2006.01)
*H05K 1/11* (2006.01)

(52) U.S. Cl.
CPC ...... *G02F 1/13458* (2013.01); *H01L 23/5226* (2013.01); *H01L 23/53209* (2013.01); *H01L 27/124* (2013.01); *H01L 27/3223* (2013.01); *H01L 33/08* (2013.01); *H01L 2224/73204* (2013.01); *H05K 1/111* (2013.01); *H05K 2201/09781* (2013.01)

(56) References Cited

U.S. PATENT DOCUMENTS

| | | |
|---|---|---|
| 2004/0027528 A1 | 2/2004 | Nam et al. |
| 2005/0195356 A1 | 9/2005 | Aruga et al. |
| 2008/0158466 A1 | 7/2008 | Lee |
| 2009/0008803 A1 | 1/2009 | Hou |

\* cited by examiner

DISPLAY DEVICE HAVING DRIVER IC DIRECTLY CONNECTED TO SUBSTRATE

CROSS REFERENCE TO RELATED APPLICATION

This application is continuation of U.S. patent application Ser. No. 13/845,400, filed on Mar. 18, 2013, and claims priority from Japanese Patent Application JP 2012-088871 filed on Apr. 10, 2012, the contents of which are hereby incorporated by reference into this application.

BACKGROUND OF THE INVENTION

1. Field of the Invention

The present invention relates to a display device that improves the reliability of connection in the case where an IC driver is connected by Chip On Glass (COG).

2. Description of the Related Art

A liquid crystal display device includes a thin film transistor (TFT) substrate on which pixel electrodes, TFTs, and the like are formed in a matrix arrangement and a counter substrate on which a black matrix, an overcoat film, or the like is formed at locations as matched with the pixel electrodes on the TFT substrate as the counter substrate is opposite to the TFT substrate, and liquid crystals are sandwiched between the TFT substrate and the counter substrate. Images are formed by controlling the optical transmittance of liquid crystal molecules for each pixel.

Since the liquid crystal display device is flat and light-weighted, the applications of the liquid crystal display device are widely spread in various fields from large-sized display devices such as a TV set to a mobile telephone, a DSC (Digital Still Camera), and the like. In order to externally supply electric power and signals to a liquid crystal display panel, a flexible wiring board is connected to a terminal unit on the TFT substrate. Moreover, in a small-sized liquid crystal display device, an IC driver is directly connected to a TFT substrate by COG. Also in the case where a flexible wiring board is connected to a TFT substrate as well as in the case where an IC driver is connected to a TFT substrate by COG, an anisotropic conductive film (ACF) is often used. The ACF includes conductive particles in a resin film, and the conductive particles conduct electricity between the terminal unit formed on the TFT substrate and the flexible wiring board, or between the terminal unit and the IC driver.

A terminal is formed in which a through hole is formed on a gate insulating film or a passivation film that is a protective film on a portion of a gate line or a drain line extending from a display region and the through hole is covered with a conductive metal oxide. Japanese Patent Application Laid-Open Publication No. 2000-221540 describes a configuration in which in the case where there are conductive beads between terminal through holes, a dummy through hole is formed between the terminals in order to prevent connections between conductive beads in the through holes and a flexible wiring board from being blocked by the conductive beads between the through holes. Namely, a dummy through hole is formed between terminals, so that such an event can be prevented by causing conductive beads to enter the dummy through hole that the electrical continuity of conductive beads on the terminals is blocked. Therefore, it is necessary to form the dummy through hole described in Japanese Patent Application Laid-Open Publication No. 2000-221540 on both sides of terminals.

SUMMARY OF THE INVENTION

In a small-sized liquid crystal display device, an IC driver is directly connected to a TFT substrate by COG. COG is a connecting method for compression bonding of the bumps of the IC driver to terminals formed on the TFT substrate through an ACF. FIG. 15 is a plan view and FIG. 16 is a cross sectional view in the case where a gate terminal metal that a gate interconnection extends to a terminal is used for a terminal. FIG. 15 is exemplary gate terminal metals using a gate line for a terminal metal. Although there is also the case where a drain line is used for a terminal metal, an example will be described that a gate line is used for a terminal metal in the following description. A gate terminal metal is simply referred to as a terminal metal unless otherwise specified.

Gate lines extending from a display region are covered with a gate insulating film and an inorganic passivation film. In a terminal unit, protective films such as the gate insulating film and the inorganic passivation film are etched to form through holes, and terminal metals are exposed. The exposed terminal metals are covered with a conductive metal oxide film such as ITO (Indium Tin Oxide), and connected to the bumps of an IC driver for electrical continuity.

In FIG. 15, for the width of the through holes, a width w2 of an outermost through hole is wider than a width w1 of a through hole on the inner side of the outermost through hole. This is called a loading effect, which is a phenomenon that when some through holes are disposed densely and some are coarsely, etching advances quickly on a portion where through holes are disposed coarsely. In other words, since no through hole exists on one side of the outermost through hole, protective films are quickly etched, and the width of the through hole is increased.

FIG. 16 is a cross sectional view along a line E-E in FIG. 15. In FIG. 15, the terminal metal has a structure in which a cap metal is disposed on an Al alloy. The cap metal is formed of MoCr or MoW. Even though moisture or oxygen enters through pin holes or the like on ITO, the Al alloy of a layer below can be protected. It is noted that an Al alloy is formed of AlCu, AlNd, or the like. Although the electric conductivity of an Al alloy is high, the stability against moisture or the like is low.

In FIG. 16, on portions of the terminal metals, through holes are formed on the gate insulating film and the inorganic passivation film that are protective films. For the width of the through holes, the width w2 of the outermost terminal is wider than the width w1 of the terminal on the inner side. Moreover, in etching the through holes, the cap metal is also slightly etched with an etchant. Since the etching rate is fast on the outermost terminal, the insulating film that is a protective film is etched as well as the cap metal of the terminal metal is etched.

After forming the through holes, the terminal metals are covered with ITO, for example, not shown. However, when ITO includes pin holes, for example, moisture or oxygen enters. When the cap metal is removed with the etchant for the insulator as removed on the outermost terminal, the Al alloy is exposed, and moisture or the like entering through the pin holes on ITO impairs the Al alloy for causing conduction failure.

In other words, in the configuration of the conventional IC driver terminal unit, the reliability of the outermost terminal is a problem. It is an object of the present invention to improve the reliability of a display device such as a liquid crystal display device by making the reliability of the outermost terminal equal to the reliability of terminals on other portions.

The present invention is made to overcome the problem. Specific schemes are as follows.

(1) A display device includes a TFT substrate including a terminal region and a display region on which a pixel including a TFT is formed in a matrix arrangement, and an IC driver is connected to the terminal region of the TFT substrate. An IC terminal to be connected to the IC driver is formed on the terminal region. The IC driver includes a bump to be connected to the IC terminal. A plurality of the IC terminals are formed at a predetermined pitch, a dummy terminal is formed on an outer side of an IC terminal located on an outermost side of the plurality of the IC terminals, the dummy terminal is not connected to an interconnection on the display region, and no dummy terminal is formed on an inner side of the IC terminal located on the outermost side.

(2) In the display device described in (1), the bump of the IC driver is not connected to the dummy terminal.

(3) In the display device described in (2), the dummy terminal includes a through hole formed at least on an insulating film.

(4) In the display device described in (3), the dummy terminal includes ITO covering the through hole.

(5) In the display device described in (4), in the dummy terminal, a terminal metal is formed in the through hole.

(6) In the display device described in (2), a pitch between the IC terminals is different from a pitch between the IC terminal located on the outermost side and the dummy terminal.

(7) In the display device described in (6), a pitch between the IC terminal located on the outermost side and the dummy terminal ranges from 10 to 100 μm.

According to the present invention, the dummy terminal is formed on the outer side of the outermost IC terminal, and the loading effect on the outermost IC terminal is made equal to the loading effect on the other IC terminals, so that the reliability of the outermost IC terminal can be maintained similarly to the reliability of the other IC terminals. Accordingly, it is possible to improve the reliability of a display device.

DETAILED DESCRIPTION OF THE PREFERRED EMBODIMENTS

Figure 1:
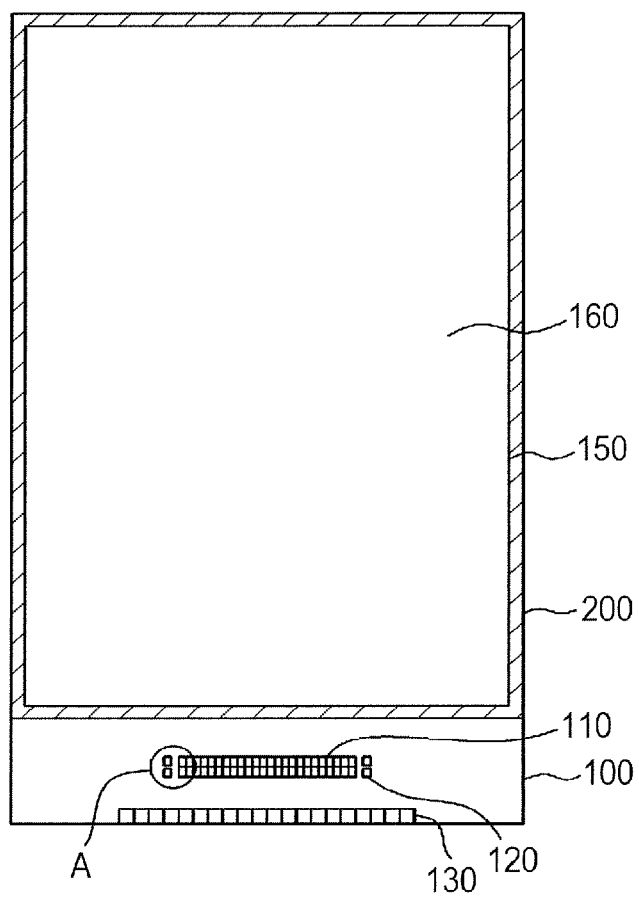
FIG. 1 is a plan view of a liquid crystal display device to which the present invention is applied.

In the following, the content of the present invention will be described in detail with reference to embodiments.
First Embodiment FIG. 1 is an example of a liquid crystal display device to which the present invention is applied. FIG. 1 is a liquid crystal display device for use in a mobile telephone or the like, for example. In a display region 160 in FIG. 1, pixels including TFTs and pixel electrodes are formed in a matrix arrangement on a TFT substrate 100, and a counter substrate 200 including color filters and the like is bonded to the TFT substrate 100 through a sealing material 150. A liquid crystal layer, not shown, is sandwiched between the TFT substrate 100 and the counter substrate 200.

The TFT substrate 100 is formed larger than the counter substrate 200. A portion where the TFT substrate 100 is provided in a single substrate is a terminal region in which IC terminals 110 to be connected to a driver IC 10 or the like and flexible wiring board terminals 130 to be connected to an external circuit, for example, are formed. Dummy terminals 120 are formed on the outer side of the IC terminals 110.

Figure 2:
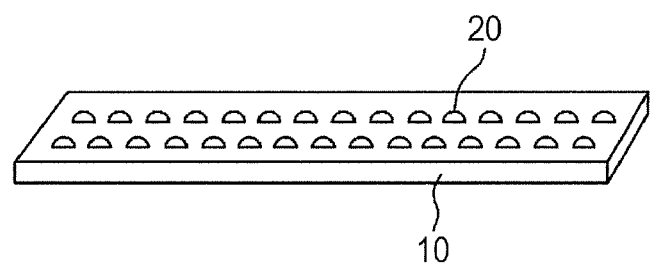
FIG. 2 is a perspective view of the back surface of an IC driver.
Figure 3:
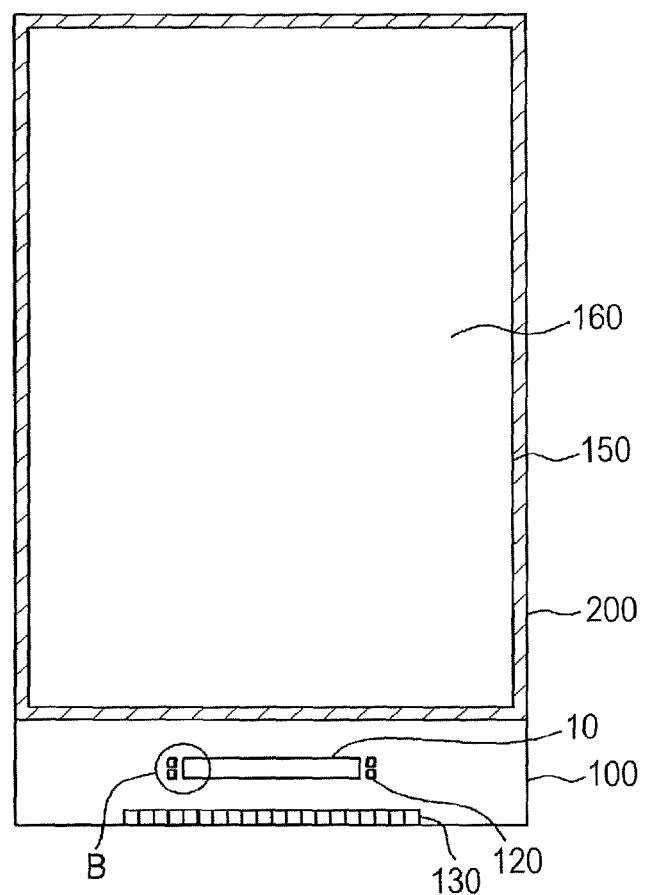
FIG. 3 is a plan view of the IC driver connected to a liquid crystal display panel.

Bumps 20 on the IC 10 are connected to the IC terminals 110. FIG. 2 is a perspective view when the IC 10 is seen from the back surface. The bumps 20 are formed on the bottom face of the IC 10 as corresponding to the IC terminals 110 on the TFT substrate 100. FIG. 3 is a plan view of the liquid crystal display device in the state in which the IC 10 is connected to the IC terminals 110 in FIG. 1. In FIG. 3, the IC 10 is connected to the IC terminals 110 on the TFT substrate 100, and the dummy terminals 120 are formed on the outer side of the IC 10. The bumps 20 on the IC 10 are not connected to the dummy terminals 120.

Figure 4:
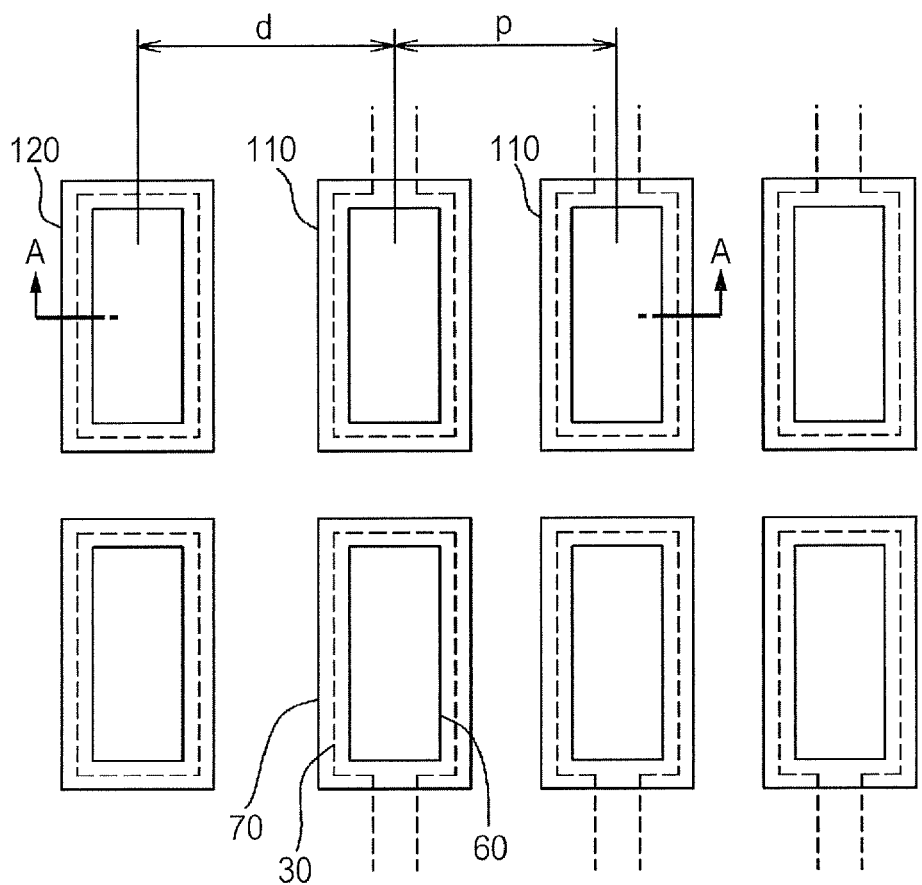
FIG. 4 is a detailed plan view of a portion A in FIG. 1.

FIG. 4 is a plan view of a portion A in FIG. 1. In FIG. 4, the dummy terminals 120 are disposed on the outer side of the outermost IC terminal 110. On the inner side of the outermost IC terminal 110, the IC terminals 110 are continuously formed at a pitch p. Interconnections extend from the display region 160 to the IC terminals 110 on the upper row, and interconnections extend to the IC terminals 110 on the lower row toward the direction of the flexible wiring board terminals 130. On the other hand, no interconnections extend from the display region 160 side or the flexible wiring board terminals 130 side to terminal metals 30 of the dummy terminals 120. This is because the dummy terminals 120 do not serve as interconnections.

In FIG. 4, the terminal metals 30 and the interconnections are protected by a gate insulating film and an inorganic passivation film, not shown. On the IC terminal 110, a through hole 60 is formed on the gate insulating film and the inorganic passivation film by etching. ITO 70 that is a transparent conductive film is formed so as to cover the through hole 60. The ITO 70 is formed to cover the end of the inorganic passivation film as well. The ITO 70 prevents the terminal metal 30 from corroding with moisture or the like.

Figure 5:
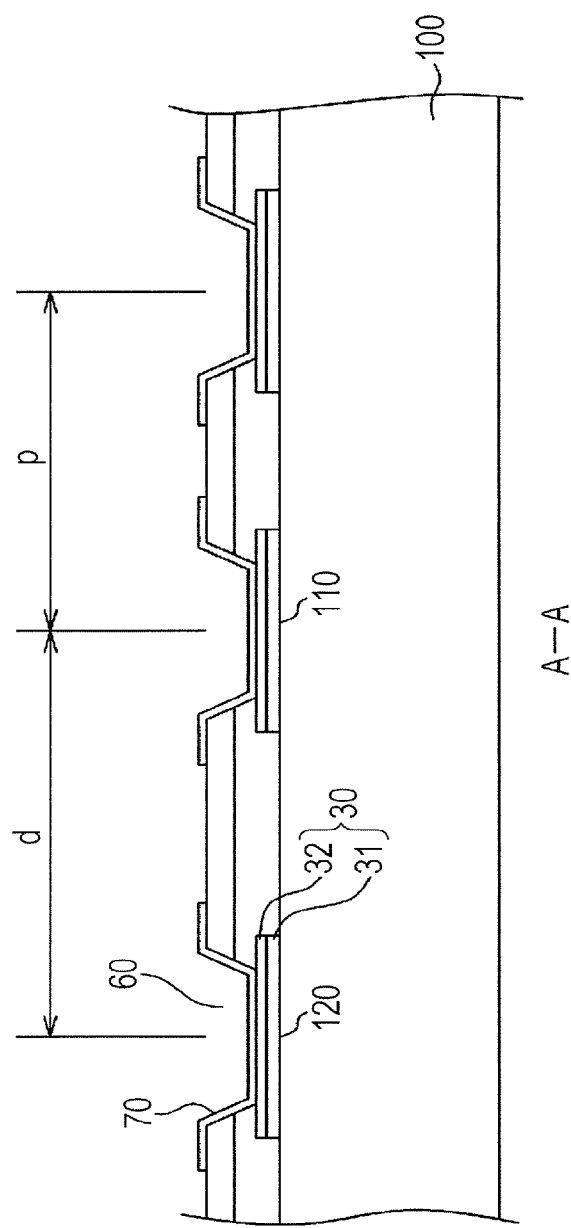
FIG. 5 is a cross sectional view along a line A-A in FIG. 4.

FIG. 5 is a cross sectional view along a line A-A in FIG. 4. In FIG. 5, the terminal metal 30 is formed as a stacked body of an Al alloy 31 and a cap metal 32 on the TFT substrate 100. The Al alloy 31 is formed of AlCu or an AlNd alloy, for example, and the thickness ranges from 100 to 300 nm. The cap metal 32 is formed of MoCr or MoW, for example, and the thickness ranges from 40 to 80 nm.

The through hole 60 is formed on the terminal metal 30 through the gate insulating film 40 and the inorganic passivation film 50, and the ITO 70 is formed so as to cover the through hole 60. In FIG. 5, the dummy terminal 120 is formed on the outer side of the outermost IC terminal 110. The cross sectional structure of the dummy terminal 120 is the same as the cross sectional structure of the IC terminal 110. Since the dummy terminal 120 exists on the outer side of the outermost IC terminal 110, the loading effect on the outermost IC terminal 110 in etching is the same as the loading effect on the other IC terminals 110. Therefore, the diameter of the through hole 60 of the outermost IC terminal 110 and the state of the cap metal 32 on the through hole 60 can be made equal to the other IC terminals 110.

In FIGS. 4 and 5, a pitch between the IC terminals 110 is p, and a pitch between the outermost IC terminal 110 and the dummy terminal 120 is d. It is ideal to make the pitches d and p equal because the dummy terminal 120 serves to make the loading effect on the outermost IC terminal 110 the same. However, the pitches d and p do not necessarily have to be the same. The size of the pitch d can be set in the range of 10 to 100 µm. This is because 10 µm is the size due to the accuracy in the present manufacture processes and it is difficult to sufficiently achieve the purpose of making the loading effect uniform when the size exceeds 100 µm.

Figure 6:
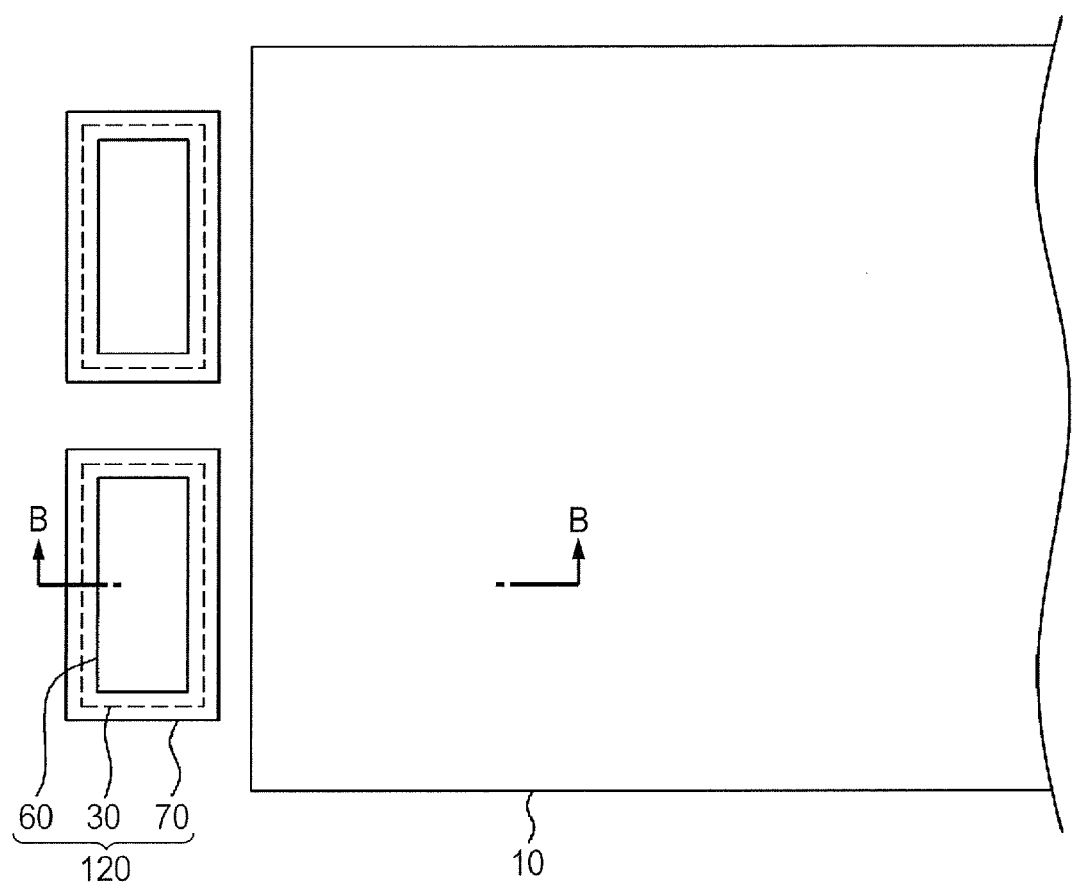
FIG. 6 is a detailed diagram of a portion B in FIG. 3.

FIG. 6 is an enlarged plan view of a region B in FIG. 3. The dummy terminals 120 exist on the outer side of the IC 10. The dummy terminal 120 is configured in which the terminal metal 30 is formed in an island shape, the through hole 60 is formed on the gate insulating film 40 and the inorganic passivation film 50 on the terminal metal 30, and the ITO 70 covers the through hole 60.

Figure 7:
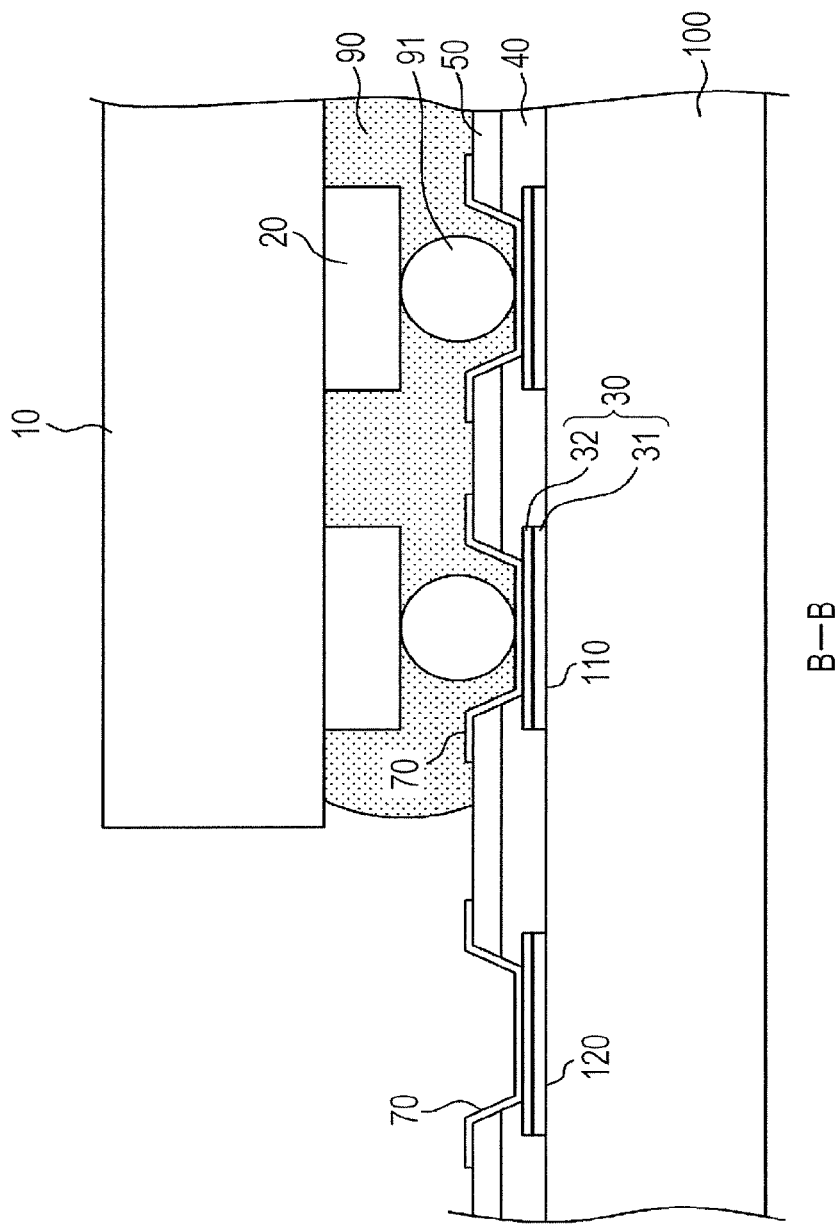
FIG. 7 is a cross sectional view along a line B-B in FIG. 6.

FIG. 7 is a cross sectional view along a line B-B in FIG. 6. In FIG. 7, the IC terminals 110 formed on the TFT substrate 100 are connected to the bumps 20 on the IC 10 through an ACF 90. Conductive particles 91 in the ACF 90 conduct electricity between the IC terminals 110 and the bumps 20 on the IC 10. As illustrated in FIG. 7, the bumps 20 on the IC 10 are not connected to the dummy terminal 120. The dummy terminal 120 serves to control the loading effect on the outermost IC terminal 110, and the dummy terminal 120 is unnecessary to conduct electricity.

Figure 8:
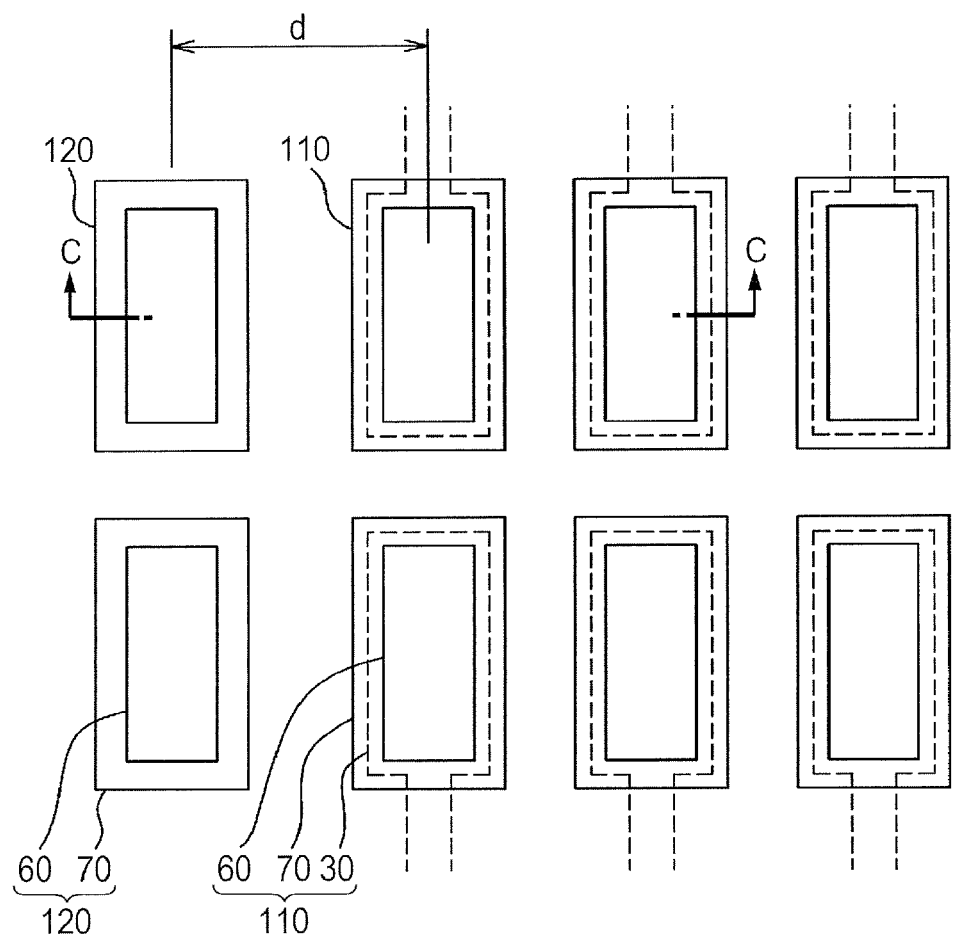
FIG. 8 is a detailed plan view of another example of the portion A in FIG. 1.

Since the dummy terminal 120 controls the loading effect on the outermost IC terminal 110, the dummy terminal 120 is unnecessary to have the same shape as the shape of the IC terminal 110. Namely, it is sufficient that the through hole 60 of the dummy terminal 120 is formed on the outer side of the outermost IC terminal 110 simultaneously when the through hole 60 is formed on the gate insulating film 40 and the inorganic passivation film 50 that are protective films. FIG. 8 is an example that the terminal metal 30 does not exist on the dummy terminal 120. Since the dummy terminal 120 is unnecessary to provide electrical connection, it is unnecessary to provide the terminal metal 30 below the through hole 60.

Figure 9:
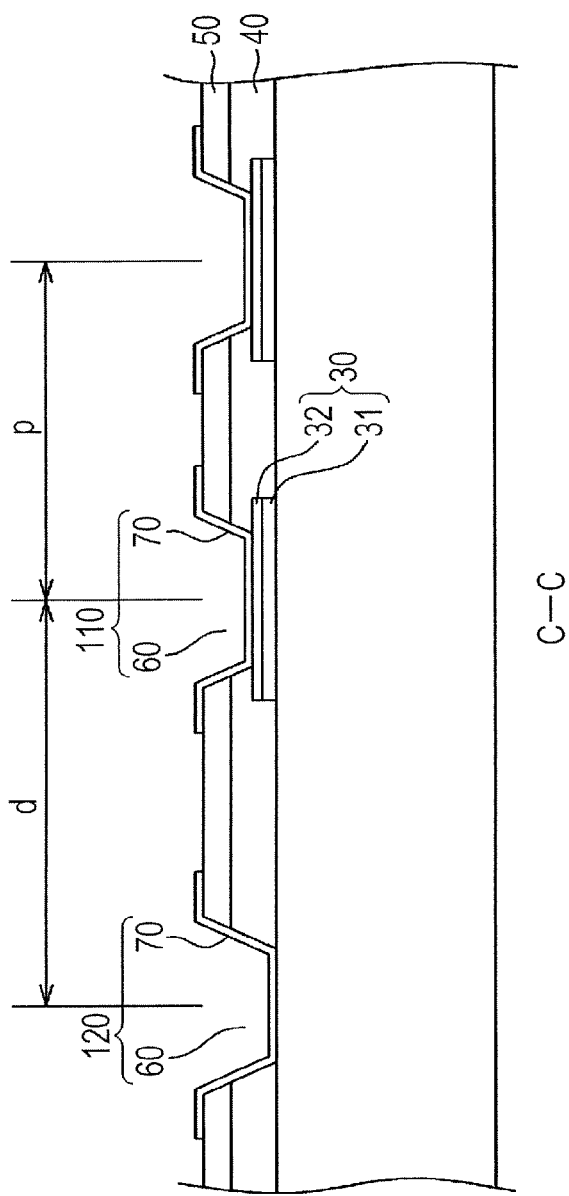
FIG. 9 is a cross sectional view along a line C-C in FIG. 8.

FIG. 9 is a cross sectional view along a line C-C in FIG. 8. In FIG. 9, the terminal metal 30 does not exist below the through hole 60 of the dummy terminal 120. However, as similar to the IC terminal 110, the ITO 70 exists so as to cover the through hole 60 of the dummy terminal 120. The pitch between the outermost IC terminal 110 and the dummy terminal 120 is d in FIGS. 8 and 9, and the pitch d ranges from 10 to 100 µm.

Figure 10:
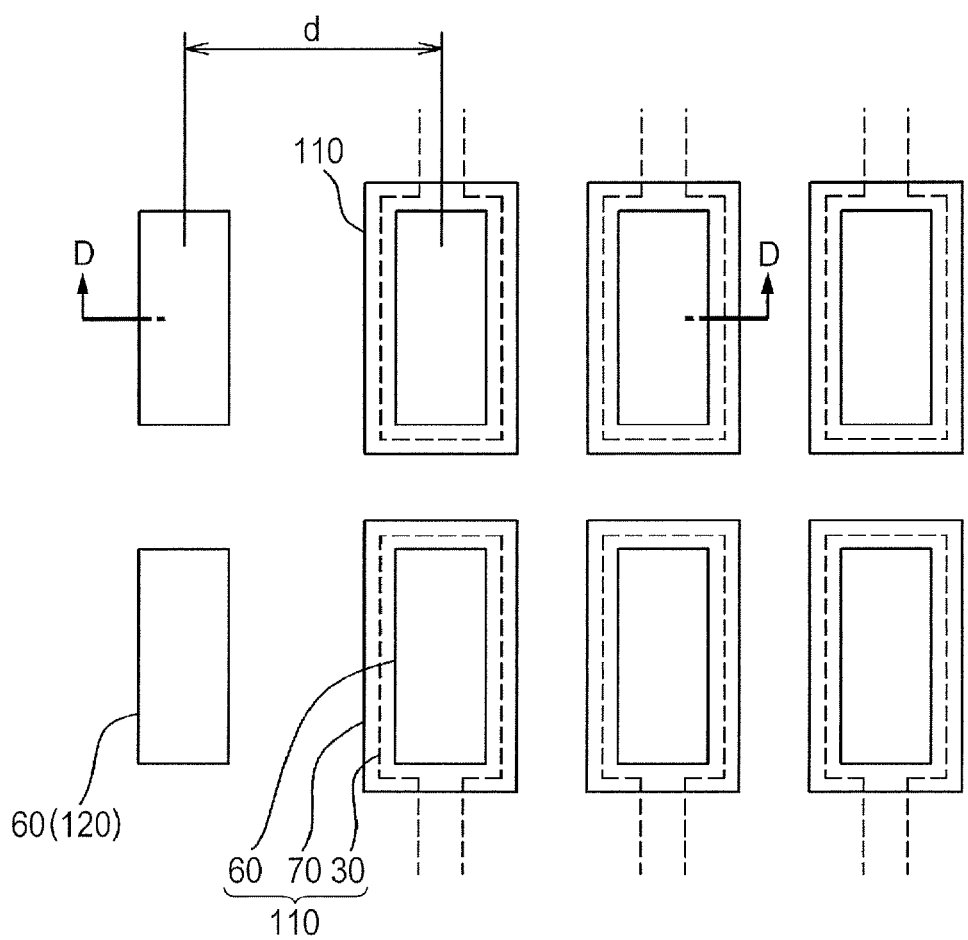
FIG. 10 is a detailed plan view of still another example of the portion A in FIG. 1.

FIG. 10 is the case where the dummy terminals 120 are further simplified, the terminal metal 30 and the ITO 70 are omitted, and only the through holes 60 are formed. Since the loading effect causes a problem in the case where the through holes 60 are formed on the gate insulating film 40 and the inorganic passivation film 50, the through holes 60 are formed as the dummy terminals 120 when etching the gate insulating film 40 and the inorganic passivation film 50, so that the dummy terminals 120 serve their roles.

Figure 11:
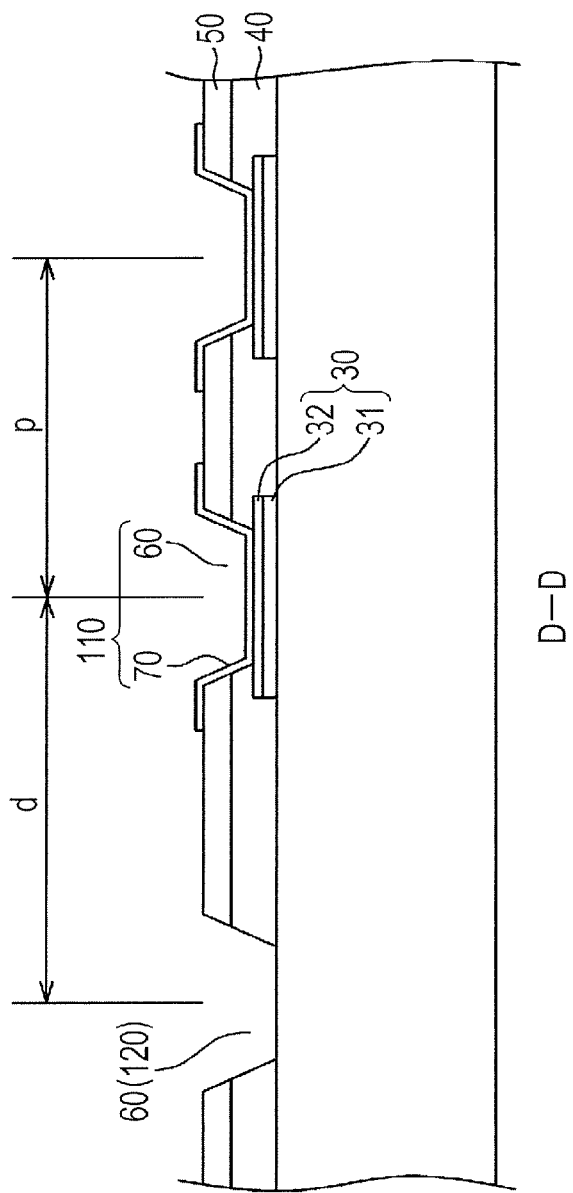
FIG. 11 is a cross sectional view along a line D-D in FIG. 10.

FIG. 11 is a cross sectional view along a line D-D in FIG. 10. In FIG. 11, only the through hole 60 is formed on the dummy terminal 120. In FIGS. 10 and 11, the pitch between the IC terminals 110 is p, the pitch between the outermost IC terminal and the dummy terminal 120 is d, and the value of the pitch d ranges from 10 to 100 µm.

Figure 12:
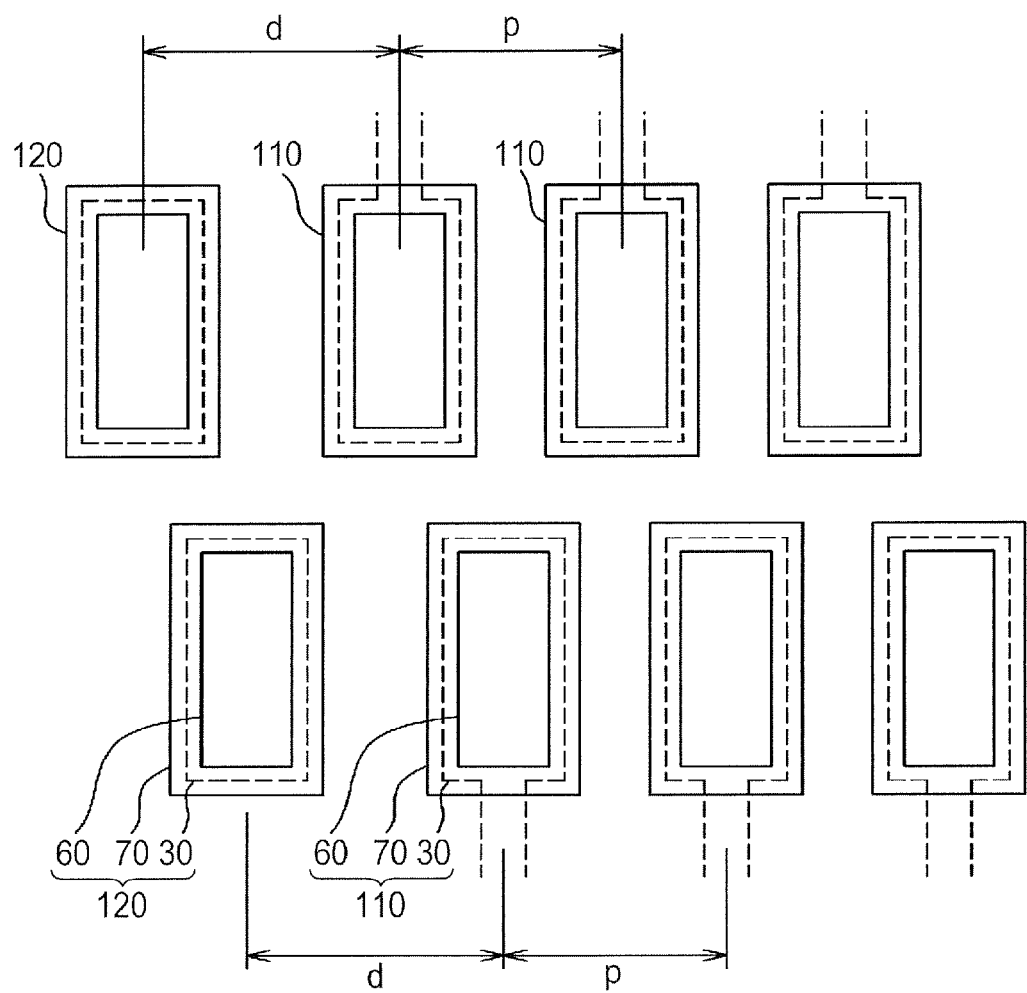
FIG. 12 is a plan view of an example in which the present invention is applied to another example of an array of IC terminals.

The examples in FIGS. 4, 8, and 10 are examples that the IC terminals 110 are disposed in parallel with each other. The effect of the dummy terminals 120 described in the terminal arrangement in FIGS. 4, 8, 10, and the like is the same in the case where the IC terminals 110 take other arrays. FIG. 12 is the case where the IC terminals 110 take a so-called staggered arrangement. Also in this case, the pitch between the IC terminals is p, and the pitch between the outermost IC terminal and the dummy terminal is d. The configuration of the dummy terminal 120 is the same as the terminal structure of the IC terminal 110 except that no interconnection is connected to the terminal metal 30 and the dummy terminal 120 has an island shape. Also in the example in FIG. 12, the bumps 20 on the IC 10 are not connected to the dummy terminals 120.

It is noted that the terminal configuration of the dummy terminal 120 is not limited to the case in FIG. 12, and the terminal configuration may be the configuration as described in FIG. 8 in which the terminal metal 30 does not exist, and the configuration as described in FIG. 10 in which none of the terminal metal 30 or the ITO 70 exists and only the through hole 60 exists.

Second Embodiment

Figure 13:
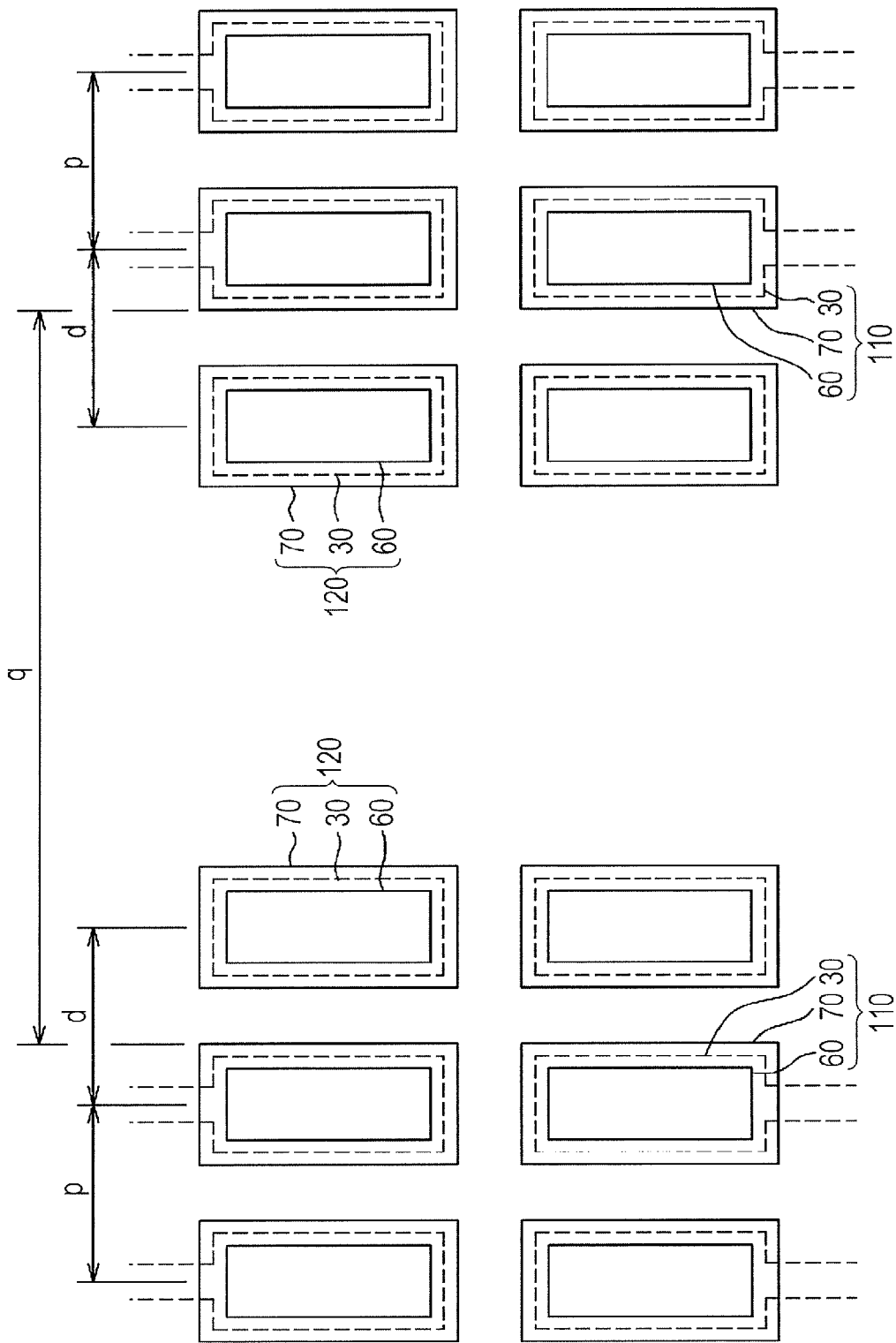
FIG. 13 is a plan view of an example in which the present invention is applied to still another example of an array of IC terminals.
Figure 15:
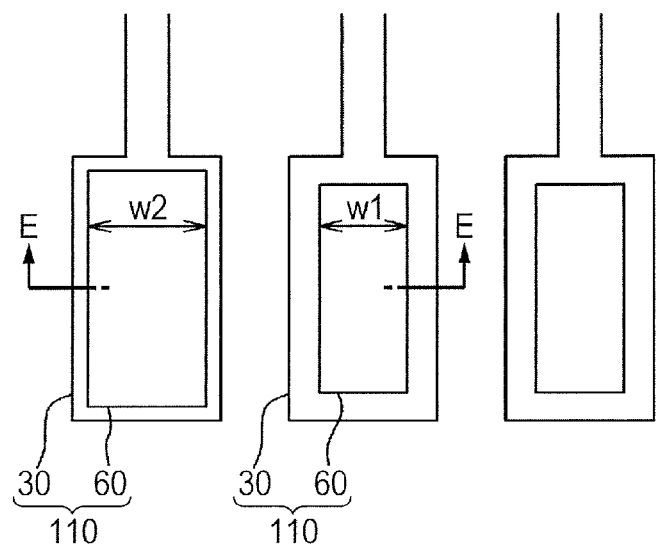
FIG. 15 is a plan view of a problem of IC terminals of a conventional example.
Figure 16:
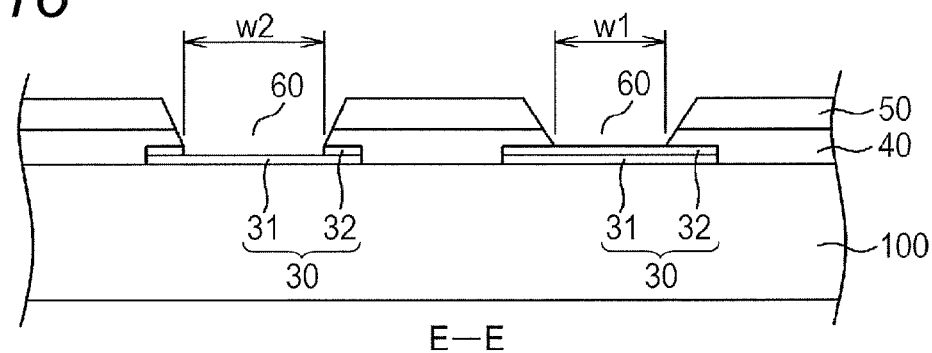
FIG. 16 is a cross sectional view along a line E-E in FIG. 15.

The first embodiment is configured in which the dummy terminals 120 are formed on the outer side of the outermost IC terminals 110, and in the case where the IC 10 is connected, the bumps 20 on the IC 10 are not connected to the dummy terminals 120. On the other hand, in the case where a standard IC 10 is used, the IC terminals 110 formed on the TFT substrate 100 are not always connected to all the bumps 20 on the IC 10. Namely, there is sometimes the case where the IC terminals 110 on the TFT substrate 100 are not formed at locations corresponding to a plurality of the bumps 20 on the inner side, not the bumps 20 on the IC 10 on the outermost side. In this case, the IC terminals 110 at the end of the portion where the IC terminals 110 are not formed are different in the loading effect, and the problem as described in FIGS. 15 and 16 probably occurs. FIG. 13 is an exemplary arrangement of IC terminals 110 and dummy terminals 120 on a TFT substrate 100 for coping with this problem.

In FIG. 13, although a plurality of the IC terminals 110 are arranged at a pitch p on both sides of the TFT substrate 100, no IC terminals 110 exist in an interval q. Thus, the loading effect on the IC terminal 110 at the end contacting a region where no IC terminals 110 exist is different from the loading effect on the other IC terminals 110. It is noted that as in FIG. 13, the IC terminal 110 at the end contacting the region where no IC terminals 110 exist is also referred to as the outermost IC terminal.

In order to prevent degradation in the reliability of the outermost IC terminal 110 caused by the difference in the loading effect as described above, in the embodiment, the dummy terminal 120 is formed on the outer side of the outermost IC terminal 110. The configuration of the dummy terminal 120 is the same as the configuration described in FIG. 4. The dummy terminals 120 are formed on the outer side of the left outermost IC terminal 110 and the outer side of the right outermost IC terminal 110 in FIG. 13. In the embodiment, bumps 20 on an IC 10 are connected to the dummy terminals 120. The pitch between the IC terminals 110 is p, and the pitch between the outermost IC terminal 110 and the dummy terminal 120 is d. The pitch d ranges from 10 to 100 μm. The reason is the same as the reason described in the first embodiment.

Moreover, the dummy terminal 120 in FIG. 13 may have the terminal structure in FIG. 8 or FIG. 10. This is because the purpose for the existence of the dummy terminal 120 is to control the loading effect on the outermost IC terminal 110.

The diameter of the through hole 60 of the dummy terminal 120 in the first embodiment and the second embodiment is not clearly described in FIGS. 4, 8, 10, 12, 13, and so on. However, generally, the diameter of the through hole 60 of the dummy terminal 120 is greater than the diameter of the through hole 60 of the IC terminal 110. Since the dummy terminal 120 is located at the outermost location, the diameter of the through hole 60 is increased depending on the difference in the loading effect. Furthermore, the difference in the loading effect on the dummy terminal 120 causes excessive etching, and this sometimes partially eliminates the cap metal 32 of the terminal metal 30. However, the characteristics of the display device have no problem.

Figure 14:
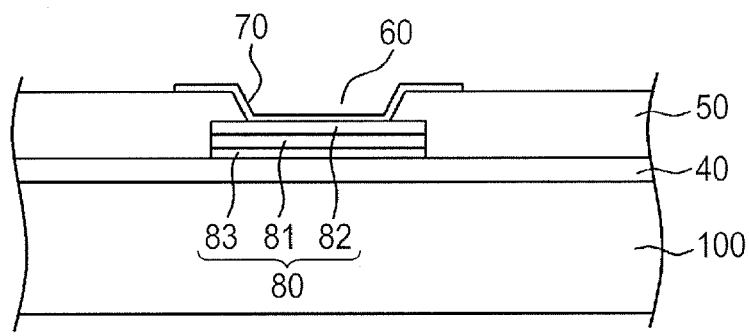
FIG. 14 is a cross sectional view in the case where a drain line is used for a terminal metal.

In the description above, an example is described that the gate line is used for the terminal metal 30. However, the present invention is also applicable to the case where the drain line is used for the terminal metal 30. FIG. 14 is a cross sectional view of a terminal in the case where the drain line is used for the terminal metal 30. In FIG. 14, a gate insulating film 40 is formed on the TFT substrate 100, and a terminal metal 80 is formed on the gate insulating film 40. The terminal metal 80 in this case has the same configuration as the configuration of the drain line, in which a base metal 83 is formed below an Al alloy 81 and a cap metal 82 is formed on the Al alloy 81. For example, the Al alloy 81 is formed of AlCu, AlNd, or the like, and the thickness ranges from 60 to 200 nm. For example, the base metal 83 is formed of MoCr or MoW, and the thickness ranges from 20 to 40 nm. For example, the cap metal 82 is formed of MoCr or MoW, and the thickness ranges from about 40 to 80 nm.

An inorganic passivation film 50 is formed so as to cover the terminal metal 80 as described above, and the through hole 60 is formed on the inorganic passivation film 50 at the portion of the terminal metal 80. ITO 70 is formed so as to cover the through hole 60. When the through hole 60 is formed, the following case sometimes occurs as similar to the case of the terminal metal 30 using the gate line, in which the outermost IC terminal 110 is formed greater than the through holes 60 of the other IC terminals 110 caused by the difference in the loading effect, or the cap metal 82 of the terminal metal 80 is eliminated in etching the inorganic passivation film 50 for exposing the Al alloy 81. Therefore, the dummy terminal 120 is formed on the outer side of the outermost IC terminal 110, so that the reliability of all the IC terminals 110 can be improved.

It is noted that as apparent from FIGS. 4, 8, 10, 12, 13, and so on, in the configuration of the present application, no dummy terminals 120 are formed on the inner side of the outermost IC terminals 110.

The description hereinabove mainly describes the case where the present invention is applied to a liquid crystal display device. However, the present invention is also applicable to an organic electroluminescent display device as well as a liquid crystal display device. In the organic electroluminescent display device, pixels include TFTs for a switching device and an organic electroluminescent layer for a light emitting element, the pixels are formed in a matrix arrangement on a device substrate (a TFT substrate), and a sealing substrate (a counter substrate) is bonded to the device substrate through a sealing material in order to protect organic electroluminescent elements from moisture or the like. IC terminals are then formed on the device substrate (the TFT substrate) for connecting an IC driver. Therefore, the basic configuration of connecting the IC driver is the same as the configuration of the liquid crystal display device, and the present invention mentioned above is also applicable to the organic electroluminescent display device.

The invention claimed is:

1. A display device comprising:
   a TFT substrate formed with a display area where pixels are arranged in a matrix form; and
   a driver IC connected to the TFT substrate via an anisotropic conductive film,
   wherein a plurality of first electrodes connected to the driver IC are formed with a first pitch on the TFT substrate,
   wherein a second electrode formed on an outer side of a first electrode located on an outermost of the plurality of first electrodes with a second pitch, which is larger than the first pitch, the second electrode does not overlap with the driver IC,
   wherein a first metal, a cap metal formed on the first metal, an insulating layer formed on the cap metal, and a metal oxide film formed on the insulating layer are formed on the TFT substrate,
   wherein the metal oxide film and the cap metal connects via a first through hole formed in the insulating layer in the plurality of the first electrodes, and
   wherein the metal oxide film is formed on the TFT substrate via a second through hole in the second electrode.

2. A display device comprising:
   a TFT substrate formed with a display area where pixels are arranged in a matrix form, and
   a driver IC connected to the TFT substrate via an anisotropic conductive film,
   wherein a plurality of first electrodes connected to the driver IC are formed with a first pitch on the TFT substrate,
   wherein a second electrode formed on an outer side of a first electrode located on an outermost of the plurality of first electrodes with a second pitch, which is larger than the first pitch, the second electrode doesn't overlap with the driver IC,
   wherein the second electrode does not overlap with anisotropic conductive film,
   wherein a first metal, a cap metal formed on the first metal, an insulating layer formed on the cap metal, and a metal oxide film formed on the insulating layer are formed on the TFT substrate, wherein the metal oxide film and the cap metal connect via a first through hole formed in the insulating layer in the plurality of the first electrodes, and wherein, the metal oxide film is formed on the TFT substrate via a second through hole in the second electrode.

3. A display device comprising:

a TFT substrate formed with a display area where pixels are arranged in a matrix form; and a driver IC connected to the TFT substrate via an anisotropic conductive film, wherein a plurality of first electrodes connected to the driver IC are formed with a first pitch on the TFT substrate, wherein a second electrode formed on an outer side of a first electrode located on an outermost of the plurality of first electrodes with a second pitch, which is larger than the first pitch, the second electrode doesn't overlap with the driver IC, wherein a first metal, a cap metal formed on the first metal, an insulating layer formed on the cap metal, and a metal oxide film formed on the insulating layer are formed on the TFT substrate, wherein the metal oxide film and the cap metal connects via a first through hole formed in the insulating layer in the plurality of the first electrodes, wherein the metal oxide film and the cap metal connect via a second through hole formed in the insulating layer in the second electrode, and wherein the cap metal at the second through hole is thinner than the cap metal at the first through hole.

4. The display device according to claim 3, wherein the second electrode does not overlap with the anisotropic conductive film.

5. The display device according to claim 1, wherein the second electrode is a dummy terminal.

6. The display device according to claim 2, wherein the second electrode is a dummy terminal.

7. The display device according to claim 3, wherein the second electrode is a dummy terminal.

8. The display device according to claim 4, wherein the second electrode is a dummy terminal.

\* \* \* \* \*